United States Patent [19]

Jäger et al.

[11] 4,075,044

[45] Feb. 21, 1978

[54] METHOD OF PRODUCING A SILICEOUS COVER LAYER ON A SEMICONDUCTOR ELEMENT BY CENTRIFUGAL COATING UTILIZING A MIXTURE OF SILICA EMULSIONS

[75] Inventors: Hans Jäger, Bad Homburg; Emil Seipp, Eschborn, both of Germany

[73] Assignee: S.A. Metallurgie Hoboken-Overpelt N.V., Belgium

[21] Appl. No.: 657,317

[22] Filed: Feb. 11, 1976

[30] Foreign Application Priority Data

Feb. 15, 1975 Germany .............................. 2506457

[51] Int. Cl.$^2$ ..................... H01L 21/20; H01L 21/31; H01L 21/316
[52] U.S. Cl. ..................................... 148/175; 148/187; 148/188; 156/626; 156/654; 427/85; 427/93; 427/95; 427/240; 427/372 A; 427/377
[58] Field of Search ....................... 148/175, 187, 188; 427/82, 85, 93, 95, 240, 372 A, 377, 387; 156/612, 17, 626, 654

[56] References Cited

U.S. PATENT DOCUMENTS

| | | | |
|---|---|---|---|
| 3,212,921 | 10/1965 | Pliskin et al. .......................... | 427/240 |
| 3,298,879 | 1/1967 | Scott et al. ............................. | 148/187 |
| 3,303,399 | 2/1967 | Hoogendoorn et al. ........... | 427/95 X |
| 3,461,550 | 8/1969 | Aklufi ................................. | 427/240 X |
| 3,492,174 | 1/1970 | Nakamura et al. ............... | 148/187 X |
| 3,584,264 | 6/1971 | McLouski et al. ................ | 427/240 X |
| 3,632,434 | 1/1972 | Hutson .............................. | 427/240 X |
| 3,669,693 | 6/1972 | Dalton et al. ....................... | 427/93 X |
| 3,769,104 | 10/1973 | Ono et al. ............................ | 148/175 |
| 3,789,023 | 1/1974 | Ritchie .............................. | 148/188 X |
| 3,850,686 | 11/1974 | Flowers .................................. | 427/82 |
| 3,928,225 | 12/1975 | Schafer ............................. | 427/85 X |
| 3,969,168 | 7/1976 | Kuhn ...................................... | 156/17 |

FOREIGN PATENT DOCUMENTS

1,099,098 1/1968 United Kingdom ................. 148/175

OTHER PUBLICATIONS

Ladd, et al., "Autodoping Effects at the Interface of GaAs–Ge Heterojunctions," Metallurgical Trans., vol. 1, Mar. 1970, p. 609–616.

Primary Examiner—L. Dewayne Rutledge
Assistant Examiner—W. G. Saba
Attorney, Agent, or Firm—McGlew and Tuttle

[57] ABSTRACT

A method of producing a siliceous cover layer on a semiconductor element or wafer so that the temperature coefficient of the cover layer is approximated to the temperature coefficient of the semiconductor wafer, comprises distributing a combined emulsion over the wafer by centrifugal force. The combined emulsion is formed by making a mixture of a first emulsion of a non-doped, pure, silica emulsion and a second emulsion of a heavily-doped silica emulsion and adjusting the ratio of the first and second emulsions so that the temperature coefficient of the formed layer will be substantially identical with the temperature coefficient of the semiconductor element in form of a wafer or die. After the cover layer is hardened, the peripheral bead which forms from the emulsion mixture is etched off so that the exposed semiconductor surface, as well as the front side of the semiconductor die or wafer, are ready for epitaxial coating.

7 Claims, 2 Drawing Figures

METHOD OF PRODUCING A SILICEOUS COVER LAYER ON A SEMICONDUCTOR ELEMENT BY CENTRIFUGAL COATING UTILIZING A MIXTURE OF SILICA EMULSIONS

FIELD AND BACKGROUND OF THE INVENTION

This invention relates in general to the formation of cover layers on semiconductors in the form of a wafer or die and, in particular, to a new and useful method of producing a siliceous cover layer on a semiconductor wafer or die by centrifugal coating.

DESCRIPTION OF THE PRIOR ART

The present invention relates to a method of producing a siliceous cover layer on a semiconductor die, such as a disc or thin wafer, in which an emulsion is distributed over the die by centrifugal force and, thereupon, hardened by drying and heating, and the temperature coefficient of the cover layer is approximately equal to the temperature coefficient of the semiconductor die or wafer.

There are known emulsions which can be deposited on semiconductor materials by centrifugal coating, spraying or immersion techniques and which, after being dried and heated, form siliceous layers. Also available are doped emulsions which include a layer having not only $SiO_2$, but also phosphorus, arsenic, antimony or boron. As a rule, these latter substances should diffuse from the silicate basis into the underlying semiconductor. These known layers have the disadvantage, however, that at higher temperatures, and if they are deposited in a thickness of about 0.1 to 0.2 $\mu$m, they show cracks. Thereby, their usefulness in most applications is considerably limited.

SUMMARY OF THE INVENTION

The present invention is directed to a method of applying a siliceous cover layer on a semiconductor die or wafer in a manner which securely eliminates a formation of cracks even at high temperatures. In addition, it is possible to deposit the layer in an economical manner, while using as simple a means as possible.

In accordance with the invention, a non-doped, pure, silica emulsion and a heavily-doped silica emulsion are mixed with each other, and applied on semiconductor, in a manner such that the glass layer forming on the semiconductor die or wafer during the hardening has a temperature coefficient which is substantially identical with the temperature coefficient of the semiconductor material. In this connection, the term "doping" is understood to mean the addition of doping substances in relatively high quantities, i.e., of the order of magnitude of percents.

In one advantageous version of the invention, phosphorus is used for doping the emulsion.

In another version of the inventive method, the siliceous cover layer is used for covering the backside of a germanium die or wafer and the front side of the die or wafer is provided with an epitaxial layer of a semiconductor compound such as GaAs and/or a GaAs P mixture.

According to a further development of the invention, after the hardening of the cover layer a peripheral bead which is formed on the germanium die or wafer is etched off, and the semiconductor surface thereby exposed, as well as the front side of the semiconductor die or wafer, are epitaxially coated. Advantageously, the cover layer is applied by centrifugally coating which hardens at temperatures between 250° and 350° C.

Accordingly, it is an object of the invention to provide an improved method of producing a siliceous cover layer on a semiconductor element or wafer, which has a temperature coefficient which is approximately equal to the temperature coefficient of the semiconductor element or wafer, which comprises forming a combined emulsion by mixing a first emulsion of a non-doped, pure, silica emulsion and a second emulsion of a heavily-doped, silica emulsion in proportion so that, they produce a combined emulsion having a temperature coefficient which is substantially identical with the temperature coefficient of the semiconductor element or wafer.

A further object of the invention is to provide a semiconductor which includes a semiconductor die or wafer, a cover layer on said die or wafer made up of a mixture of first and second emulsions, said first emulsion comprising a non-doped, pure silica emulsion and said second emulsion comprising a heavily-doped silica emulsion, the ratios of said emulsions being such as to produce a temperature coefficient of the cover layer which is substantially identical with that of said die or wafer.

The various features of novelty which characterize the invention are pointed out with particularity in the claims annexed to and forming a part of this disclosure. For a better understanding of the invention, its advantges and specific objects attained by its uses, reference should be had to the following examples and descriptive matter in which there are illustrated preferred embodiments of the invention.

DESCRIPTION OF THE PREFERRED EMBODIMENTS

Figure 1:
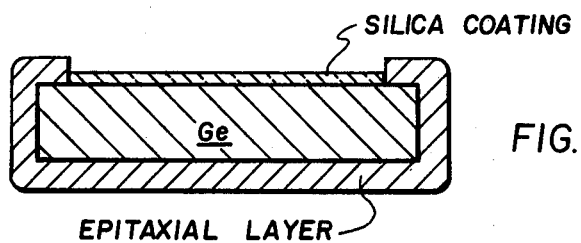
FIG. 1 is a side sectional view of a wafer or die according to the invention showing the epitaxial layer on the wafer side opposite to the silica layer.

In accordance with the invention, it is quite essential for the method, that a non-doped, pure, silica emulsion which is convertible by thermal treatment into $SiO_2$, is mixed with a doped emulsion of high doping concentration in a manner such that the glass forming during the subsequent drying heating operation assumes a coefficient of expansion largely corresponding to that of the respective coated semiconductor die or wafer. Surprisingly, it has been found that this may be achieved by varying the mixture ratio of the emulsions and that, due to this measure, a formation of cracks during the subsequent heating can be prevented.

Pure $SiO_2$ has a very low thermal coefficient of expansion ($\alpha = 5.4 \cdot 10^{-7}$ per ° C at 20° C). Ge and GaAs have almost equal coefficients of expansion ($5.5 \cdot 10^{-6}$ per ° C at 20° C; and $6.7 \cdot 10^{-6}$ per ° C at 300° C; (see R. Feder and T. B. Light, J. Appl. Phys. 43, 3114 (1972)). Silicon, with $\alpha = 4.2 \cdot 10^{-6}$ per ° C at 20° C, shows a lower value than Ge and GaAs.

Doped silica emulsions form silica glasses which, in all cases, have higher expansion coefficients than $SiO_2$. The addition of P, As, Sb, B, Ga and similar elements to the silica emulsions is usual. Emulsions doped in such a manner, up to high doping concentrations, which is usual in glasses, are available commercially.

With respect to the coefficient of expansion $\alpha$, the following is still a problem:

The coefficient of expansion is not independent of temperature. In addition, the temperature-responsive variation of the coefficient of expansion of single-crystal semiconductors is not equal to the respective variation of the coefficient of expansion of amorphous glasses, not even under conditions under which these coefficients are equal to each other, for example, at room temperatures. Consequently, the $\alpha$ values must be adjusted so that the main values of $\alpha$ (T) of both substances correspond to each as well as possible within the interesting temperature interval from the room temperature up to the operating temperature (diffusion, epitaxy, tempering).

Further, the emulsion glass layers still change their composition during the first heating so that irreversible displacements as to the coefficient of expansion are possible.

For carrying out the invention method, it is important to optimize the mixture of a pure silica emulsion $E_1$ and a heavily-doped silica emulsion $E_2$ by submitting a series of mixtures to thermal process of interest. This may be done as follows:

Mixtures of $E_1$ and $E_2$ with a stepwise varying composition are applied to polished surfaces of a semiconductor die by centrifugal coating (so-called "spinning" as in the application of photo lacquer) in a uniform manner, i.e., at a uniform speed, period of time, etc. During this deposition, the emulsion forms a peripheral bead at the outside edge of the die, which is thicker than the layer on the remaining surface of the die. The layer is formed as a residue of the emulsion which is dissolved in a volatile solvent (ethyl alcohol). The thickness of the peripheral bead is approximately 0.5 to 1 $\mu$m and the thickness of the rest of the layer is approximately one third of this value, thus, about 0.15 to 0.3 $\mu$m. Since cracks appear, due to misadjusted coefficients of expansion, in thicker layers rather than in thinner layers, the peripheral bead is useful as a particularly sensitive indicator in the optimizing of the mixture.

After being applied, the layer is first hardened for at least 10 minutes at a temperature of approximately 300° C. Then, the semiconductor die or wafer with the layer is subjected to a thermal treatment under such conditions (or even under less favorable conditions, for example, at still higher temperatures) under which the optimized layer is to be used later. After this treatment, the die is examined microscopically for crack formation, particularly in the area of the peripheral bead. In this way, the mixture composition of emulsions $E_1$ and $E_2$ can be found at which the crack formation is minimized. In the closer vicinity of this mixture, a second series of mixtures is then examined in addition, with a small variation of the mixture ratios. As a result, the optimal composition of the emulsion mixture for a given semiconductor can be determined.

Should cracks appear even with this composition (for example, in the peripheral bead), a thinner layer may be provided. For this purpose, either the speed of the centrifugal coating is increased or the optimal mixture is diluted with a solvent, whereby nothing is changed in the composition of the later deposited layer, but the concentration of the substances dissolved in the emulsion is reduced.

While applying the invention method to a coating of semiconductor substrates such as GaAs or Ge, testing temperatures of 800° to 850° C and heating periods of 1 to 5 hours are satisfactory, as a rule, for the testing series having to find the best layer doping concentration.

Preferably, the emulsion mixture is applied to the stationary semiconductor die by dropping, so that the die is coated as uniformly as possible. Then, the "spinner" is started (a machine of the kind typically used for coating semiconductor dies with photo lacquer). Speeds from 4000 to 6000 rpm are usual, but is is possible to operate efficiently with speeds between 3000 and about 11,000 rpm. The layer thickness depends substantially on this operating speed. With the commercially available emulsions, layer thicknesses of 0.1 to 0.3 $\mu$m can be produced inside the peripheral bead.

In the following examples, the inventive method is explained in more detail:

EXAMPLE 1

In accordance with the invention, a germanium substrate in the form of a die, to be used for the epitaxial deposition of a GaAs layer or of a GaAs-GaAsp stratified layer, has been provided with a siliceous cover layer. In such a case of application, what primarily matters is that the back side of the germanium die must remain completely undamaged and, in particular, free of cracks, in spite of the high epitaxial temperature and reactive gases such as HCl. If cracks are formed, germanium in the form of volatile chlorides would continue to pass into the gas space and to dope the GaAs in an undesired manner. This phenomenon is known under the term "autodoping". In order to prevent autodoping, the cover layer has been applied in the inventive manner to the back side of the germanium die.

First, a bilaterally polished germanium die has been coated as follows: After cleaning, the die, with the side to be coated up, was placed on the suction table of the spinner. A TEFLON table with fine (ca 1 mm in diameter) suction perforations has been used in order to avoid any notable deformation even with a die thickness of 300 $\mu$m and less. First, a phosphorus-silica emulsion having a nominal concentration of $8 \cdot 10^{20} \, cm^{-3}$ (this is not the concentration of the phosphorus in the emulsion or in the silicate layer but the boundary-layer concentration which becomes established in a silicon die coated with this layer, after diffusion, at 1200° C) was homogeneously mixed with 6 parts by volume of non-doped silica emulsion. Then, with the aid of a medical syringe and an interposed fine-pored filter, this mixture was applied by dropping to the die in which the germanium, in this case, had a (100) orientation.

Figure 2:
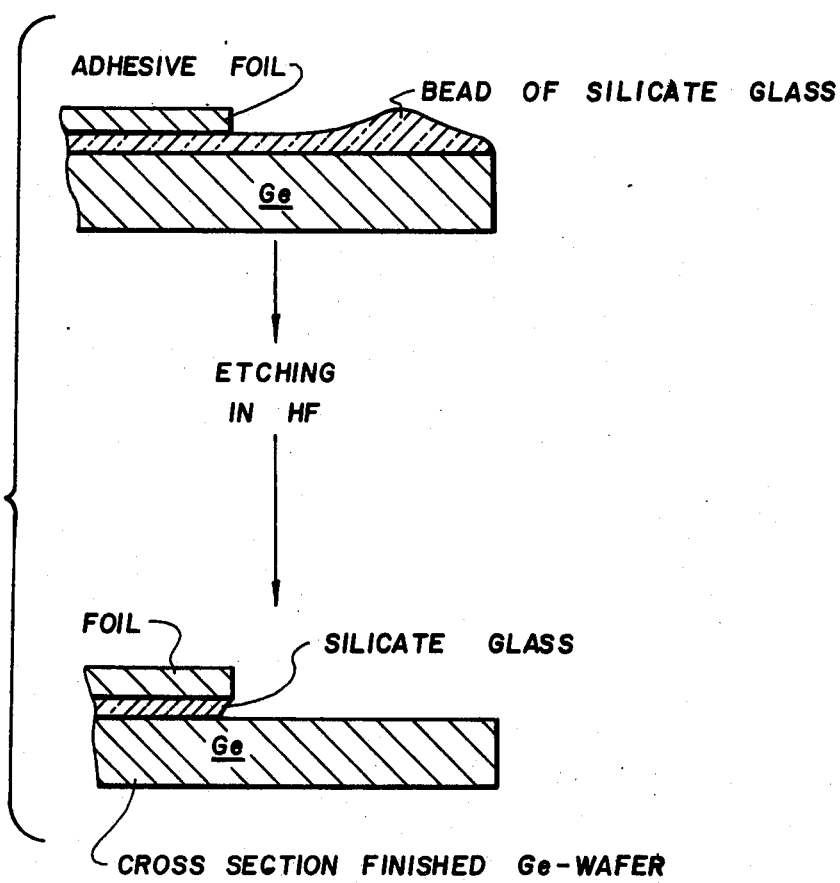
FIG. 2 is a flow sheet illustrating the process of the invention showing the method of removing the head on the periphery of the die and exposing a side of the die.

A few drops of this emulsion mixture were sufficient. Then, with a great acceleration, the suction table was brought to the desired speed. After 30 seconds at the most, a thin, firm, silicate layer formed which also was already dried. At its periphery, the layer had a thickened bead of about 0.5 to 1 mm in width, as shown in FIG. 2. This layer was hardened in air for 20 minutes at a temperature of 300° C.

At speeds between 3000 and 8000 rmp, layers were formed having a thickness of approximately 0.3 to 0.1 $\mu$m. The peripheral bead was about three times thicker.

Since, because of its thickness, a peripheral bead is particularly susceptible to crack formation, it has been etched off. To this end, the silicate layer inside the bead was covered with a self-adhesive transparent PVC foil. This circular piece had been stamped out of a larger piece of adhesive foil, by means of a hollow punch having a corresponding diameter. In order to avoid under-etching at the periphery, the die with the adhesive foil was heated fro 10 minutes at 80° C. Then, the protruding silicate and, above all, the peripheral bead, were etched off with hydrofluoric acid, as shown in FIG. 2. Thereupon, the adhesive foil was removed by dissolving in acetone.

Subsequently, the non-coated side of the germanium die was prepared for the epitaxy. This was done by a short treating with an etching reagent attacking germanium but not the silicate layers ($SiO_2$ and doped $SiO_2$). In such a treatment, germanium should not lose its polish. A 10% NaCN is well suited for this purpose. In two minutes, such a solution removes 150 A and leaves no foreign atoms behind. See: Kiewit, J. Elchem.Soc. 121, 310 (1974). A silicate layer deposited on germanium in this manner endures a typical GaAs or GaAsP epitaxial process with temperatures between 650° C and 800° C and a duration of up to 5 hours, without destruction and without becoming pervious. An epitaxially coated wafer is shown in FIG. 1.

Further, the p-doped silicate layer is suited for serving as a protective layer for the germanium substrate if, in addition to the epitaxy, diffusion processes are provided. It is ususal, for example, to diffuse zinc (Zn) into the GaAsP layers. If Zn from the gaseous phase is allowed to react with Ge, a loal alloy formation takes place producing strong deformations of the die, as well as cracks. This is to be avoided. The doped silicate layer prevents such as Zn attack.

EXAMPLE 2

Another important application of the invention coating of a semiconductor die, particularly with a p-doped layer, is connected to the Zn diffusion process in GaAs, GaAsP or GaP. Basically, two manners of use are to be considered:

a. Use as diffusion mask: The cover layer, having a coeffienct of expansion corresponding to that of the semiconductor material, is applied to the semiconductor die by centrifugal coating. After hardening the layer in air (300° C, for 10 to 20 minutes), any pattern of openings can be etched in, while using the known photo-lacquer etching technique. Through these windows, Zn (or other doping substances, such as Cd, Se, S, Te, Sn, etc.) from various sources can be diffused in. In this connection, it is essential that, due to the adjusted coefficient of expansion, the so-called lateral diffusion along the boundary surface between the silicate layer and the semiconductor is reduced to a minimum, which is of greatest importance for the III–V planar technique.

b. The second manner of use of the inventive method is the application of the cover layer to a silicate layer which serves as a diffusion source for Zn (or Cd, Se, S, Te, Sn, etc.), and is also produced by centrifugal coating and doped with the element to be diffused. The phosphorus-doped cover layer prevents the element to be diffused from disappearing in the way of the gaseous phase. At the diffusion temperature, most of the elements mentioned have a high vapor pressure. With such coated layers of diffusion sources, the diffusion can be carried out without the protection of a sealed-off ampoule and, thus, in a relatively inexpensive manner, in a stream of pure protective gas.

EXAMPLE 3

A semiconductor die had to be provided with an alloy contact of a low-melting metal (for example, In, Sn) while using a very small quantity of metal. In this case, the metal was deposited on the semiconductor by evaporation at room temperature, in the respective desired thickness, for example, about 0.1 to 1 $\mu$m. On top of this layer, the siliceous cover layer was applied also. The cover layer was cautiously hardened in air, below the melting point of the metal. Then the temperature was raised and, thereby, upon exceeding the melting point of the metal, a homogeneous alloy junction has been obtained, without the usual formation of droplets. A similar advantage can be obtained with such a layer in cases where volatile metals, such as Zn, Cd, Hg, etc., are to be alloyed in and a previous evaporation must be prevented.

Thus, in accordance with the method of the invention, semiconductor substrates can be coated in a relatively inexpensive manner with a siliceous cover layer which remains free of cracks even under the influence of high temperatures. For examples, if a germanium die as a substrate for the GaAs or GaAsP gaseous-phase epitaxy is concerned, an effective protection against the autodoping is obtained.

The advantages of the invention provisions appear also in comparison with a coating of silicon nitride $Si_3N_4$ which also provides an efficient covering, however, and can be applied to Ge only by means of expensive processes, primarily by a pyrolytic deposition at increased temperatures or by sputtering. Both methods require expensive equipment and skilled operators.

As compared thereto, the described application of the cover layer effective against autodoping by means of the centrifugal coating within the scope of the inventive method is an inexpensive and labor-saving process. The devices needed therefor are commercially available and relatively inexpensive.

In addition, an unsatisfactory layer produced in accordance with the method of the invention can be removed from the polished Ge surface in a neat, quick, and non-destructive manner, by means by hydrofluoric acid, while with $Si_3N_4$, this can be done only very slowly.

Another advantage of the use of this doped oxide is, particularly if phosphorus is employed as the dopant, that it acts simultaneously as an efficient diffusion mask against the penetration of Zn, which would not be possible, for example, with pure $SiO_2$. Should Zn penetrate into the Ge, alloys are formed, deformations of the semiconductor die occur, and cracks are produced at the respective locations. The masking against zinc is necessary if, for example, in GaAs, p-zones are to be diffused in for forming diodes (p-n junctions); with Zn, GaAs provides a p-conductor.

While specific embodiments of the invention have been described in detail to illustrate the application of the principles of the invention, it will be understood that the invention may be embodied otherwise without departing from such principles.

What is claimed is:

1. A method of coating a semiconductor wafer with a siliceous cover layer having a peripheral bead formation substantially free from cracking at elevated temperatures wherein the temperature coefficient of said cover layer is approximately equal to the temperature coefficient of the semiconductor wafer, which comprises forming a combined emulsion by mixing together a first emulsion of a non-doped, pure silica emulsion and a second emulsion of a heavily-doped silica emulsion coating a test wafer with said combined emulsion, distributing the combined emulsion so-formed over the wafer by centrifugal force at a speed from 3000 to 11,00 rpm, controlling the thickness of the peripheral bead between about 0.5 to 1 μm, and the thickness of the rest of the cover layer between about 0.15 to 0.3 μm, hardening the resultant layer for at least 10 minutes at a temperature of about 300° C, thereafter subjecting the hardened cover layer to thermal treatment at temperatures in excess of 300° C, at which the so-treated layer is to be employed later and then examining said layer microscopically for crack formation in the area of the peripheral bead and selecting the optimum mixture of said first and second emulsions, thereby adjusting the ratio of the first and second emulsions that they produce a combined emulsion having a temperature coefficient substantially identical with the temperature coefficient of the semi-conductor wafer, coating device wafers with said optimum mixture of emulsions, distributing said optimum mixture of combined emulsions over the wafers by centrifugal force at a speed from 3000 to 11,000 rpm. and drying heating the so-coated wafers to harden the coating of siliceous cover layer on said wafers.

2. A method of producing a siliceous cover layer on a semiconductour wafer, according to claim 1, wherein said semiconductor wafer comprises germanium, and including forming said combined emulsion cover layer on a back side of said wafer and forming an epitaxial layer of a semiconductor compound, such as GaAs on the front side of the wafer opposite to the back side of the wafer where the siliceous cover layer is applied.

3. A method of producing a siliceous cover layer on a semiconductor wafer, according to claim 2, wherein a peripheral bead of the combined emulsion is formed on said back side of said germanium wafer, and including etching-off the bead to expose a semiconductor surface therebeneath and covering this side with an epitaxial layer of a semiconductor compound such as GaAs.

4. A method of producing a siliceous cover layer on a semiconductor wafer, according to claim 2, wherein said cover layer is hardened at temperatures in the range of from between 250° to 350° C.

5. A method of producing a siliceous cover layer on a semiconductor wafer, according to claim 1, wherein said second emulsion is doped with a phosphorus.

6. A method of producing a siliceous cover layer on a semiconductive wafer, according to claim 1, wherein in accordance with the method, a semiconductor part having a diode or transistor structure is effected and including forming said combined emulsion cover layer as a diffusion mask.

7. A method of producing a siliceous cover layer on a semiconductor wafer, according to claim 1, wherein the semiconductor wafer is used as a diffusion source for Zn, Cd, Si, S, Te or Sn, the siliceous cover layer is used for suppressing an evaporation away from the diffusing substance.

* * * * *